United States Patent
Mei et al.

(10) Patent No.: US 11,309,412 B1
(45) Date of Patent: Apr. 19, 2022

(54) SHIFTING THE PINCH-OFF VOLTAGE OF AN INP HIGH ELECTRON MOBILITY TRANSISTOR WITH A METAL RING

(71) Applicant: NORTHROP GRUMMAN SYSTEMS CORPORATION, Falls Church, VA (US)

(72) Inventors: Xiaobing Mei, Manhattan Beach, CA (US); Wayne Yoshida, Redondo Beach, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 503 days.

(21) Appl. No.: 15/597,368

(22) Filed: May 17, 2017

(51) Int. Cl.
*H01L 29/66* (2006.01)
*H01L 29/778* (2006.01)
*H01L 29/417* (2006.01)
*H01L 29/45* (2006.01)

(52) U.S. Cl.
CPC .... *H01L 29/7787* (2013.01); *H01L 29/41758* (2013.01); *H01L 29/452* (2013.01)

(58) Field of Classification Search
CPC ............... H01L 29/20; H01L 29/66462; H01L 29/7787; H01L 29/41758; H01L 29/452
USPC .................................................. 257/190, 194
See application file for complete search history.

(56) References Cited

U.S. PATENT DOCUMENTS

| | | | | |
|---|---|---|---|---|
| 4,186,410 A | * | 1/1980 | Cho | H01L 21/28575 257/280 |
| 4,212,020 A | * | 7/1980 | Yariv | H01L 27/15 257/267 |
| 4,593,300 A | * | 6/1986 | Shur | H01L 27/0688 257/192 |
| 4,652,896 A | * | 3/1987 | Das | H01L 29/7787 257/194 |
| 4,745,449 A | * | 5/1988 | Chang | H01L 27/1443 257/257 |
| 4,774,205 A | * | 9/1988 | Choi | H01L 21/8258 148/DIG. 149 |
| 4,789,645 A | * | 12/1988 | Calviello | H01L 21/707 148/DIG. 14 |

(Continued)

OTHER PUBLICATIONS

Ajayan et al., "20 nm high performance enhancement mode InP HEMT with heavily doped S/D regions for future THz applications", Superlattice and Microstructures 100 (2016) pp. 526-534.*

(Continued)

*Primary Examiner* — Jay C Kim
(74) *Attorney, Agent, or Firm* — John A. Miller; Shumaker, Loop & Kendrick, LLP

(57) ABSTRACT

A high electron mobility transistor (HEMT) device comprising a substrate, a plurality of semiconductor layers provided on the substrate, and a source terminal, a drain terminal and at least one gate terminal provided on the plurality of semiconductor layers. The HEMT also includes a metal ring formed on the plurality of semiconductor layers around the source terminal, the drain terminal and the at least one gate terminal, where the metal ring operates to shift the pinch-off voltage of the device. In one embodiment, the metal ring includes an ohmic portion and an electrode portion, where both the ohmic portion and the electrode portion include a lower titanium layer, a middle platinum layer and an upper gold layer.

20 Claims, 1 Drawing Sheet

(56) References Cited

U.S. PATENT DOCUMENTS

| | | | | |
|---|---|---|---|---|
| 4,818,721 A * | 4/1989 | Wang | H01L 21/2656 | 438/91 |
| 4,821,093 A * | 4/1989 | Iafrate | H01L 29/0657 | 257/194 |
| 4,857,980 A * | 8/1989 | Hoeberechts | H01L 27/1443 | 257/436 |
| 4,908,325 A * | 3/1990 | Berenz | H01L 21/28587 | 148/DIG. 139 |
| 5,021,857 A * | 6/1991 | Suehiro | H01L 21/30621 | 257/194 |
| 5,084,744 A * | 1/1992 | Hori | H01L 29/808 | 257/270 |
| 5,107,318 A * | 4/1992 | Makiuchi | H01L 27/1443 | 257/184 |
| 5,155,050 A * | 10/1992 | Bayraktaroglu | G01S 13/91 | 257/E27.012 |
| 5,192,698 A * | 3/1993 | Schuermeyer | H01L 21/8252 | 148/DIG. 65 |
| 5,242,839 A * | 9/1993 | Oh | H01L 21/8252 | 257/292 |
| 5,285,087 A * | 2/1994 | Narita | H01L 29/7783 | 257/190 |
| 5,364,816 A * | 11/1994 | Boos | H01L 29/42316 | 257/276 |
| 5,365,087 A * | 11/1994 | Sasaki | H01L 27/1443 | 257/184 |
| 5,367,182 A * | 11/1994 | Matsugatani | H01L 29/205 | 257/190 |
| 5,371,383 A * | 12/1994 | Miyata | H01L 29/1079 | 117/929 |
| 5,391,895 A * | 2/1995 | Dreifus | H01L 29/0847 | 257/77 |
| 5,408,106 A * | 4/1995 | Seabaugh | B82Y 10/00 | 257/17 |
| 5,429,963 A * | 7/1995 | Martinez | H01L 21/8252 | 257/E21.697 |
| 5,436,468 A * | 7/1995 | Nakata | H01L 21/0251 | 257/14 |
| 5,445,985 A * | 8/1995 | Calviello | H01L 27/0605 | 257/E27.012 |
| 5,491,348 A * | 2/1996 | Koyamao | H01L 29/045 | 257/66 |
| 5,508,535 A * | 4/1996 | Nakanishi | H01L 21/306 | 257/192 |
| 5,550,388 A * | 8/1996 | Haruyama | H01L 29/7783 | 257/190 |
| 5,702,975 A * | 12/1997 | Yoon | H01L 21/28587 | 257/E21.407 |
| 5,796,127 A * | 8/1998 | Hayafuji | H01L 21/314 | 257/194 |
| 5,804,849 A * | 9/1998 | Wennekers | H01L 29/8124 | 257/280 |
| 5,811,844 A * | 9/1998 | Kuo | H01L 29/7785 | 257/194 |
| 5,869,856 A * | 2/1999 | Kasahara | H01L 29/1029 | 257/192 |
| 6,078,067 A * | 6/2000 | Oikawa | H01L 21/8252 | 257/192 |
| 6,090,649 A * | 7/2000 | Suemitsu | H01L 21/28587 | 257/E21.222 |
| 6,144,048 A * | 11/2000 | Suemitsu | H01L 21/28587 | 257/192 |
| 6,271,547 B1 * | 8/2001 | Hoke | H01L 29/66462 | 257/192 |
| 6,465,289 B1 * | 10/2002 | Streit | H01L 21/8252 | 257/E21.697 |
| 6,479,844 B2 * | 11/2002 | Taylor | B82Y 20/00 | 257/192 |
| 6,514,799 B2 * | 2/2003 | Litwin | H01L 21/765 | 257/E21.574 |
| 6,524,899 B1 * | 2/2003 | Grundbacher | H01L 21/30612 | 257/E21.22 |
| 6,593,603 B1 * | 7/2003 | Kim | H01L 29/7785 | 257/192 |
| 6,797,994 B1 * | 9/2004 | Hoke | H01L 21/28587 | 257/192 |
| 6,831,345 B2 * | 12/2004 | Kinoshita | H01L 29/0619 | 257/492 |
| 6,844,592 B2 * | 1/2005 | Yamaguchi | H01L 29/0634 | 257/341 |
| 6,943,387 B2 * | 9/2005 | Ohbu | H01L 29/0692 | 257/197 |
| 7,087,957 B2 * | 8/2006 | Matsuda | H01L 27/0605 | 257/330 |
| 7,135,411 B2 * | 11/2006 | Nam | H01L 21/30621 | 438/714 |
| 7,268,027 B2 * | 9/2007 | Kwon | G02B 6/12004 | 257/E21.047 |
| 7,573,079 B2 * | 8/2009 | Takahashi | H01L 27/0605 | 257/192 |
| 7,579,634 B2 * | 8/2009 | Onodera | H01L 29/0692 | 257/192 |
| 7,667,302 B1 * | 2/2010 | Chang | H01L 23/5225 | 257/508 |
| 7,723,753 B2 * | 5/2010 | Sasaki | H01L 21/8252 | 257/197 |
| 7,759,698 B2 * | 7/2010 | Ogura | H01L 27/14603 | 257/185 |
| 8,183,558 B2 * | 5/2012 | Makiyama | H01L 29/7787 | 257/194 |
| 8,415,713 B2 * | 4/2013 | Ogura | H01L 31/1123 | 257/187 |
| 8,530,933 B2 * | 9/2013 | Ogura | H01L 27/1446 | 257/184 |
| 8,841,154 B2 * | 9/2014 | Yoon | H01L 21/28008 | 257/E21.205 |
| 8,916,459 B2 * | 12/2014 | Takahashi | H01L 29/0649 | 257/E21.068 |
| 8,936,976 B2 * | 1/2015 | Radosavljevic | H01L 21/2256 | 438/172 |
| 9,070,683 B2 * | 6/2015 | Fender | H01L 22/34 | |
| 9,076,906 B2 * | 7/2015 | Ogura | H01L 31/1105 | |
| 9,196,560 B2 * | 11/2015 | Roth | H01L 29/0619 | |
| 9,196,614 B2 * | 11/2015 | Kub | H01L 29/41725 | |
| 9,450,147 B2 * | 9/2016 | McGroddy | H01L 27/016 | |
| 9,461,159 B1 * | 10/2016 | Chou | H01L 29/401 | |
| 9,508,652 B1 * | 11/2016 | Herrault | H01L 23/40 | |
| 9,741,634 B2 * | 8/2017 | Nogami | H01L 23/3157 | |
| 9,876,082 B2 * | 1/2018 | Hanson | H01L 29/66462 | |
| 2002/0115303 A1 * | 8/2002 | Ohta | H01L 21/316 | 438/765 |
| 2003/0132496 A1 * | 7/2003 | Terano | H01L 29/475 | 257/449 |
| 2007/0120153 A1 * | 5/2007 | Williams | H01L 29/66878 | 257/280 |
| 2007/0131938 A1 * | 6/2007 | Williams | H01L 27/085 | 257/77 |
| 2008/0258242 A1 * | 10/2008 | Mei | H01L 29/0891 | 257/410 |
| 2010/0244146 A1 * | 9/2010 | Uno | H01L 29/7813 | 257/401 |
| 2018/0151715 A1 * | 5/2018 | Chowdhury | H01L 29/7787 | |

OTHER PUBLICATIONS

Sun et al., "Physical modeling of direct current and radio frequency characteristics for InP-based InAlAs/InGaAs HEMTs", Chinese Physics B 25 (2016) 108501.*

Ajayan et al., "A review of InP/InAlAs/InGaAs based transistors for high frequency applications", Superlattice and Microstructures 86 (2015) pp. 1-19.*

Alim et al., "Device considerations and characterizations of pre and post fabricated GaAs based pHEMTs using multilayer 3D MMIC technology", Semiconductor Science and Technology 32 (2017) 055003.*

Mimura, "Development of High Electron Mobility Transistor", Japanese Journal of Applied Physics 44 (2005) pp. 8263-8268.*

(56) References Cited

OTHER PUBLICATIONS

Kuroda et al., "A New Fabrication Technology for AlGaAs/GaAs HEMT LSI's Using InGaAs Nonalloyed Ohmic Contacts", IEEE Transactions on Electron Devices 36 (1989) pp. 2196-2203.*

Mimura, "Development of High Electron Mobility Transistor", Japanese Journal of Applied Physics 12 (2005) pp. 8263-8268.*

Zhong et al., "0.15-μm T-gate In0.52Al0.48As/In0.53Ga0.47As InP-based HEMT with fmax of 390 GHz," Chinese Physics B 22 (2013) 128503.*

Zhong et al., "An 88 nm gate-length In0.53Ga0.47As/In0.52Al0.48As InP-based HEMT with fmax of 201 GHz," Journal of Semiconductors 33 (2012) 074004.*

Zhong et al., "Impact of the lateral width of the gate recess on the DC and RF characteristics of InAlAs/InGaAs HEMTs," Journal of Semiconductors 33 (2012) 054007.*

Huang et al., "Fabrication of a 120 nm gate-length lattice-matched InGaAs/InAlAs InP-based HEMT," Journal of Semiconductors 31 (2010) 094008.*

Yamashita et al., "High fT 50-nm-Gate InAlAs/InGaAs High Electron Mobility Transistors Lattice-Matched to InP Substrates," Japanese Journal of Applied Physics 39 (2000) pp. L 838-L 840.*

Endoh et al., "InP-Based High Electron Mobility Transistors with a Very Short Gate-Channel Distance," Japanese Journal of Applied Physics 42 (2003) pp. 2214-2218.*

Chang et al., "InAs Thin-Channel High-Electron-Mobility Transistors with Very High Current-Gain Cutoff Frequency for Emerging Submillimeter-Wave Applications," Applied Physics Express 6 (2013) 034001.*

Fatah et al., "Bias-Dependent Radio Frequency Performance for 40 nm InAs High-Electron-Mobility Transistor with a Cutoff Frequency Higher than 600 GHz," Japanese Journal of Applied Physics 51 (2012) 110203.*

Wang et al., "Design of InAlAs/InGaAs PHEMTs and small-signal modeling from 0.5 to 110 GHz," Journal of Semiconductors 36 (2015) 024005.*

Zhong et al., "Impact of the Silicon-nitride Passivation Film Thickness on the Characteristics of InAlAs/InGaAs InP-based HEMTs," Journal of the Korean Physical Society 66 (2015) pp. 1020-1024.*

Zhou et al., "Growth condition optimization and mobility enhancement through inserting AlAs monolayer in the InP-based InxGa1—xAs/In0.52Al0.48As HEMT structures," Chinese Physics B 25 (2016) 096801.*

Ajayan et al., "20 nm high performance enhancement mode InP HEMT with heavily doped S/D regions for future THz applications," Superlattices and Microstructures 100 (2016) pp. 526-534.*

Ajayan et al., "A review of InP/InAlAs/InGaAs based transistors for high frequency applications," Superlattices and Microstructures 86 (2015) pp. 1-19.*

Papageorgiou et al., "Cofabrication of Planar Gunn Diode and HEMT on InP Substrate," IEEE Transactions On Electron Devices 61 (2014) pp. 2779-2784.*

Lai et al., "Recent NGST HEMT Device & MMIC Development MMIC Array Receivers and Spectrographs Workshop" (2008).*

Kazior, "Beyond CMOS: heterogeneous integration of III-V devices, RF MEMS and other dissimilar materials/devices with Si CMOS to create intelligent microsystems," Philosophical Transactions of the Royal Society A 372 (2015) Jan. 5, 2013.*

* cited by examiner

SHIFTING THE PINCH-OFF VOLTAGE OF AN INP HIGH ELECTRON MOBILITY TRANSISTOR WITH A METAL RING

BACKGROUND

Field

This invention relates generally to a field effect transistor (FET) device and, more particularly, to a high electron mobility transistor (HEMT) device that includes a metal ring formed around the device terminals that changes the pinch-off voltage of the device.

Discussion

FET devices are well known in the transistor art, and come in a variety of types, such as HEMT, MOSFET, MISFET, FINFET, etc. A typical FET device will include various semiconductor layers, such as silicon, gallium arsenide (GaAs), indium gallium arsenide (InGaAs), indium aluminum arsenide (InAlAs), gallium nitride (GaN), indium phosphide (InP), etc. Sometimes the semiconductor layers are doped with various impurities, such as boron or silicon, to increase the population of carriers in the layer, where the higher the doping level of the layer the greater the conductivity of the particular semiconductor material. An FET device will also include a source terminal, a drain terminal and a gate terminal, where one or more of the semiconductor layers is a channel layer and is in electrical contact with the source and drain terminals. A voltage provided between the source and drain terminals allows electrical carriers, either N-type or P-type, to flow through the channel layer between the two terminals. An electrical signal applied to the gate terminal creates an electrical field in the device that modulates the carriers in the channel layer, where a small change in the gate voltage can cause a large variation in the population of carriers in the channel layer to change the current flow between the source terminal and the drain terminal. The pinch-off voltage of an FET device is the gate-to-source voltage at which the drain-to-source current becomes negligible and the device enters an off-state.

Various types of electrical circuits and devices, such as mixed-signal transceivers, require multiple FET devices for operation. In some of these types of electrical circuits, an FET device may be required to operate in a depletion mode, where the device is in an on state at a zero gate-source voltage, or in an enhancement mode, where the device is in an off state at the zero gate-source voltage, in order to provide the necessary logical gates. Thus, a normally off FET device requires a positive pinch-off voltage and a normally on FET device requires a negative pinch-off voltage.

Integrated circuits are typically fabricated by epitaxial fabrication processes that deposit or grow the semiconductor layers on a semiconductor substrate. Often, wafer level fabrication processes are employed that fabricate many integrated circuit chips on a common substrate wafer. In a traditional FET device, the source terminal and the drain terminal are fabricated on a heavily doped cap layer to provide a better conductive path to the channel layer. For certain FET devices, higher performance can be achieved by forming a recess through the cap layer and providing the gate terminal in the recess so that it is closer to the channel layer. By placing the gate terminal closer to the channel layer, the transconductance of the FET device is generally higher, which provides more effective control of the charge in the channel.

In one fabrication process, the gate recess is formed by first depositing a photoresist layer over the cap layer that is patterned to define an opening therein through which the gate recess can be etched. In order to achieve two or more different pinch-off voltages in the same integrated circuit, such as an MMIC circuit, multiple separate operations of gate processing needs to be performed so that those FET devices requiring one pinch-off voltage have one gate recess depth and those FET devices requiring another pinch-off voltage have a different gate recess depth. Because of the increased number of fabrication steps for providing multiple pinch-off voltages in different FET devices fabricated on the same wafer, such as laying down and masking the various photoresist layers to perform the second gate recess etch process, the device cycle time is increased time, which increases cost. Thus, it would be desirable to provide a single gate recess processing step, but still be able to provide multiple FET devices in a single integrated circuit chip having different pinch-off voltages.

DETAILED DESCRIPTION OF THE EMBODIMENTS

The following discussion of the embodiments of the invention directed to an FET device including a metal ring that shifts the pinch-off voltage of the device is merely exemplary in nature, and is in no way intended to limit the invention or its applications or uses. For example, the semiconductor device described herein is an HEMT device having certain semiconductors layers. However, employing a metal ring in a semiconductor device to change its pinch-off voltage may have application for other types of FET devices having different semiconductor materials.

Figure 1:
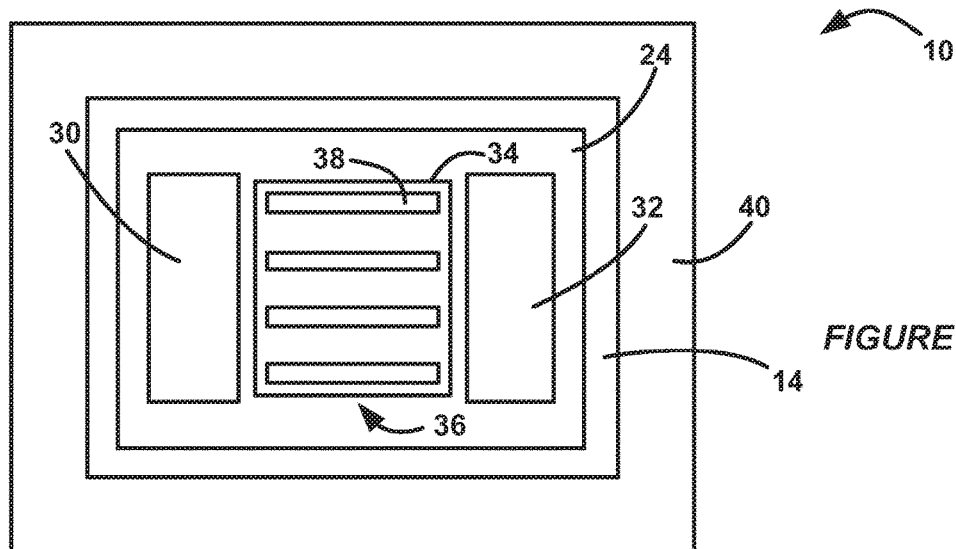
FIG. 1 is a top view of a HEMT device including a metal ring.
Figure 2:
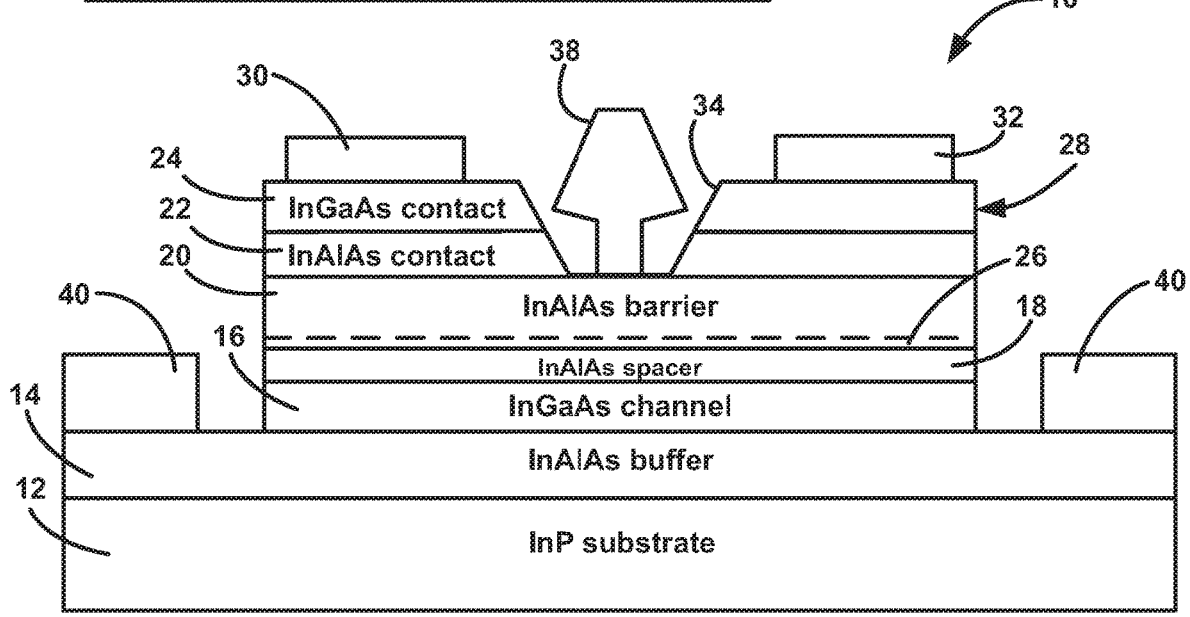
FIG. 2 is a profile view of the HEMT device shown in FIG. 1.

FIG. 1 is a top view and FIG. 2 is a profile view of an HEMT device 10 that can be employed for various applications in various integrated circuits, as will be appreciated by those skilled in the art. It is noted that the various device layers of the HEMT device 10 discussed below are merely for illustrative purposes. The HEMT device 10 includes an InP substrate 12, an InAlAs buffer layer 14 deposited on the substrate 12, an InGaAs channel layer 16 deposited on the buffer layer 14, an InAlAs spacer layer 18 deposited on the channel layer 16, an InAlAs barrier layer 20 deposited on the spacer layer 18, a silicon doped InAlAs contact layer 22 deposited on the barrier layer 20, and a silicon doped InGaAs contact layer 24 deposited on the contact layer 22. The spacer layer 18 and the barrier layer 20 are doped at their interface to define a silicon planar doping layer 26. The combination of the epitaxial layers 16, 18, 20, 22, 24 and 26 define a mesa 28 in a manner well understood by those skilled in the art. Ohmic contacts including a source terminal 30 and a drain terminal 32 are deposited on the contact layer 24. A gate recess 34 is fabricated through the contact layers 22 and 24 to the barrier layer 20 and a gate array 36 is formed in the recess 34. In this embodiment, the gate array 36 includes four T-shaped gate terminals 38, each being about 50 µm long. These described layers are known in a III-V semiconductor device as well as other III-V semiconductor materials.

As discussed above, HEMT devices are fabricated to have a certain pinch-off voltage, where multiple transistors in a specific circuit may require different pinch-off voltages for accommodating a depletion mode and an enhancement mode for binary operation. The present invention proposes fabricating a number of HEMT devices on a common substrate or wafer to have the desired pinch-off voltage for the depletion mode, and providing additional fabrication steps to provide a metal ring 40 on the buffer layer 18 adjacent to the mesa 28 only for those HEMT devices that operate in the enhancement mode. It is believed that the metal ring 40 creates an electro-chemical effect during operation of the HEMT device 10 that causes the pinch-off voltage to be reduced.

In one embodiment, the metal ring 40 is fabricated during the processing steps that form the ohmic contacts that make up the source terminal 30 and the drain terminal 32 and the gate metal that makes up the gate terminals 38, and is fabricated during a single gate process step.

Figure 3:
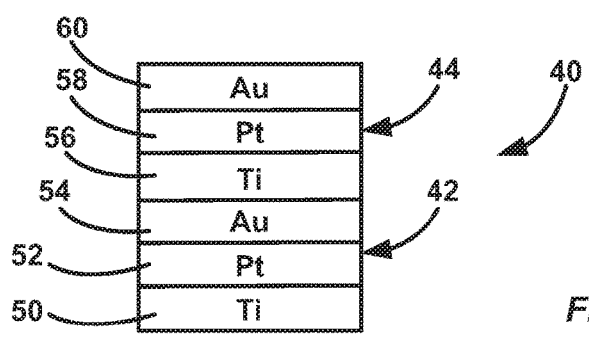
FIG. 3 is a profile view of the metal ring in the HEMT device.

In this embodiment, the metal ring 40 has a generally square configuration, a desired thickness and is continuous. In alternate embodiments, the metal ring 40 may have an open portion, and may be of a different shape, such as rectangular, oval, circular, etc. Further, the metal ring 40 can be made of any material and have any number of layers suitable for the purposes described herein. In one embodiment, as shown in FIG. 3, the metal ring 40 can have an ohmic contact portion 42 that is in contact with the buffer layer 14 and an upper electrode portion 44. In this embodiment, each of the ohmic contact portion 42 and the electrode portion 44 include three layers, where the ohmic contact portion 42 includes a lower titanium layer 50, a middle platinum layer 52 and a top gold layer 54, and the electrode portion 44 includes a lower titanium layer 56, a middle platinum layer 58 and an upper gold layer 60.

This configuration of the electrode portion 44 is the same as a traditional gate metal layered structure, where the titanium layer is selected to form a desirable Schottky junction with the barrier layer 20, and the gold layer 60 provides a low contact resistance in a manner well understood by those skilled in the art. Because the gold layer has a relatively low melting point, the platinum layer acts as a diffusion barrier to prevent gold from defusing into the titanium layer during operation of the device 10. Therefore, the ohmic contact portion is formed at the same time as the source terminal 30 and the drain terminal 32, and the electrode portion 44 is fabricated at the same time as the gate metal for the gate terminals 38. Thus, in one embodiment, the gate terminals 38 are formed by an electron beam lithography (EBL) process, well understood by those skilled in the art, where the metal ring 40 and the gate metal for the gate terminals 38 are fabricated simultaneously. During the EBL fabrication process, the entire wafer is coated with a photoresist, and an electron beam is used to expose the desired regions on those transistors that will have the metal ring 40 as well as the gate terminals 38.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A semiconductor device comprising:
a substrate;
a plurality of semiconductor layers provided on the substrate, said plurality of semiconductor layers including a buffer layer;
at least one contact layer provided on the semiconductor layers;
a source terminal and a drain terminal formed on the at least one contact layer;
at least one gate terminal formed on one of the plurality of semiconductor layers other than the buffer layer; and
a metal ring formed on the buffer layer at a location so that the source terminal, the drain terminal and the at least one gate terminal are within an outer circumference defined by the metal ring, wherein the metal ring includes an ohmic portion and an electrode portion, said metal ring operating to shift a pinch-off voltage of the device.

2. The semiconductor device according to claim 1 wherein the metal ring is a closed metal ring.

3. The semiconductor device according to claim 1 wherein the metal ring is a rectangular shaped ring.

4. The semiconductor device according to claim 1 wherein the electrode portion is fabricated at the same time as the at least one gate terminal.

5. The semiconductor device according to claim 1 wherein the ohmic portion is fabricated at the same time as the source and drain terminals.

6. The semiconductor device according to claim 1 wherein the ohmic portion includes a lower titanium layer, a middle platinum layer and an upper gold layer, and the electrode portion includes a titanium layer formed on the upper gold layer of the ohmic portion, a platinum layer formed on the titanium layer of the electrode portion and a gold layer formed on the platinum layer of the electrode portion.

7. The semiconductor device according to claim 1 wherein some of the plurality of semiconductor layers define a mesa provided on the buffer layer on which the at least one contact layer is formed, said metal ring being formed around the mesa.

8. The semiconductor device according to claim 1 wherein the substrate is an InP substrate and the plurality of semiconductor layers include an InAlAs buffer layer formed on the substrate, an InGaAs channel layer formed on the buffer layer, an InAlAs spacer layer formed on the channel layer, an InAlAs barrier layer formed on the spacer layer, an InAlAs contact layer formed on the barrier layer, and an InGaAs contact layer formed on the InAlAs contact layer, wherein the source terminal and the drain terminal are formed on the InGaAs contact layer and the at least one gate terminal is formed in a recess through the InAlAs and InGaAs contact layers to be in contact with the barrier layer.

9. The semiconductor device according to claim 1 wherein the at least one gate terminal is four gate terminals.

10. A high electron mobility transistor (HEMT) device comprising:
a substrate;
a plurality of semiconductor layers provided on the substrate, said plurality of semiconductor layers including a buffer layer;
at least one contact layer provided on the semiconductor layers;
a source terminal and a drain terminal formed on the at least one contact layer;

at least one gate terminal formed on one of the plurality of semiconductor layers other than the buffer layer; and a metal ring formed on the buffer layer at a location so that the source terminal, the drain terminal and the at least one gate terminal are within an outer circumference defined by the metal ring, wherein the metal ring includes an ohmic portion and an electrode portion, said metal ring operating to shift a pinch-off voltage of the device.

11. The HEMT device according to claim 10 wherein the metal ring is a closed metal ring.

12. The HEMT device according to claim 10 wherein the electrode portion is fabricated at the same time as the at least one gate terminal and the ohmic portion is fabricated at the same time as the source and drain terminals.

13. The HEMT device according to claim 10 wherein the ohmic portion includes a lower titanium layer, a middle platinum layer and an upper gold layer, and the electrode portion includes a titanium layer formed on the upper gold layer of the ohmic portion, a platinum layer formed on the titanium layer of the electrode portion and a gold layer formed on the platinum layer of the electrode portion.

14. The HEMT device according to claim 10 wherein some of the plurality of semiconductor layers define a mesa provided on the buffer layer on which the source, drain and gate terminals are formed, said metal ring being formed around the mesa.

15. The HEMT device according to claim 10 wherein the HEMT device is an InP device.

16. The HEMT device according to claim 10 wherein the substrate is an InP substrate, and the plurality of semiconductor layers include an InAlAs buffer layer formed on the substrate, an InGaAs channel layer formed on the buffer layer, an InAlAs spacer layer formed on the channel layer, an InAlAs barrier layer formed on the spacer layer, an InAlAs contact layer formed on the barrier layer, and an InGaAs contact layer formed on the first InAlAs contact layer, wherein the source terminal and the drain terminal are formed on the InGaAs contact layer and the at least one gate terminal is formed in a recess through the InAlAs and InGaAs contact layers to be in contact with the barrier layer.

17. A high electron mobility transistor (HEMT) device comprising:

an InP substrate;

a plurality of semiconductor layers provided on the substrate including an InAlAs buffer layer formed on the substrate, an InGaAs channel layer formed on the buffer layer, an InAlAs spacer layer formed on the channel layer, an InAlAs barrier layer formed on the spacer layer, an InAlAs contact layer formed on the barrier layer, and an InGaAs contact layer formed on the InAlAs contact layer, wherein the spacer layer, the barrier layer and the contact layers define a mesa;

a source terminal, a drain terminal and at least one gate terminal formed on the mesa; and a closed metal ring formed on the buffer layer and around the mesa, wherein the metal ring includes an ohmic portion and an electrode portion, said metal ring operating to shift a pinch-off voltage of the device.

18. The HEMT device according to claim 17 wherein the electrode portion is fabricated at the same time as the at least one gate terminal.

19. The HEMT device according to claim 17 wherein the ohmic portion is fabricated at the same time as the source and drain terminals.

20. The HEMT device according to claim 17 wherein the ohmic portion includes a lower titanium layer, a middle platinum layer and an upper gold layer, and the electrode portion includes a titanium layer formed on the upper gold layer of the ohmic portion, a platinum layer formed on the titanium layer of the electrode portion and a gold layer formed on the platinum layer of the electrode portion.

* * * * *